(12) United States Patent
Oseki et al.

(10) Patent No.: US 12,440,943 B2
(45) Date of Patent: Oct. 14, 2025

(54) METHOD AND APPARATUS FOR POLISHING WAFER

(71) Applicant: SHIN-ETSU HANDOTAI CO., LTD., Tokyo (JP)

(72) Inventors: Masaaki Oseki, Nishigo-mura (JP); Tatsuo Abe, Shirakawa (JP); Michito Sato, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 341 days.

(21) Appl. No.: 17/917,781

(22) PCT Filed: Feb. 8, 2021

(86) PCT No.: PCT/JP2021/004538
§ 371 (c)(1),
(2) Date: Oct. 7, 2022

(87) PCT Pub. No.: WO2021/205740
PCT Pub. Date: Oct. 4, 2021

(65) Prior Publication Data
US 2023/0137813 A1 May 4, 2023

(30) Foreign Application Priority Data
Apr. 9, 2020 (JP) .................... 2020-070282

(51) Int. Cl.
*B24B 37/04* (2012.01)
*B24B 37/005* (2012.01)
(Continued)

(52) U.S. Cl.
CPC .......... *B24B 37/044* (2013.01); *B24B 37/005* (2013.01); *B24B 37/042* (2013.01);
(Continued)

(58) Field of Classification Search
None
See application file for complete search history.

(56) References Cited

U.S. PATENT DOCUMENTS

| | | |
|---|---|---|
| 2010/0090314 A1 | 4/2010 | Iizuka et al. |
| 2020/0043748 A1 | 2/2020 | Liu |
| 2020/0306922 A1 | 10/2020 | Matsuda |

FOREIGN PATENT DOCUMENTS

| | | |
|---|---|---|
| CN | 103231304 A | 8/2013 |
| EP | 3 296 376 A1 | 3/2018 |

(Continued)

OTHER PUBLICATIONS

H. Xiao, Introduction to Semiconductor Manufacturing Technology, SPIE Press, ISBN 978-0-8194-9092-6, p. 523. (Year: 2012).*
Apr. 13, 2021 International Search Report issued in Patent Application No. PCT/JP2021/004538.
Jun. 12, 2024 extended Search Report issued in European Patent Application No. 21784449.7.
Feb. 21, 2025 Office Action issued in Chinese Patent Application No. 202180026701.0.
Dec. 9, 2024 Office Action issued in Korean Patent Application No. 2022-7034903.

(Continued)

*Primary Examiner* — Jiong-Ping Lu
(74) *Attorney, Agent, or Firm* — Oliff PLC

(57) ABSTRACT

A method for polishing a wafer in order to correct a shape of a polished wafer subjected to polishing, by pressing the wafer to a polishing pad while continuously supplying a composition for polishing containing water to perform correction-polishing, the method including the steps of: measuring the shape of the polished wafer before performing the correction-polishing; determining, in accordance with the measured shape of the polished wafer, a kind and concentration of a surfactant to be contained in the composition for polishing; and performing the correction-polishing while supplying the composition for polishing adjusted on a basis of the determined kind and concentration of the surfactant. This provides a method and apparatus for polishing a wafer that make it possible to reduce, in the latter polishing step, a variation in the shape of the wafer that occurred in a preceding polishing step.

10 Claims, 5 Drawing Sheets

(51) Int. Cl.
    *B24B 49/02*     (2006.01)
    *B24B 49/04*     (2006.01)
    *B24B 57/02*     (2006.01)
    *C09G 1/02*     (2006.01)
    *H01L 21/02*     (2006.01)
    *H01L 21/304*     (2006.01)
    *H01L 21/306*     (2006.01)
    *H01L 21/67*     (2006.01)

(52) U.S. Cl.
    CPC .............. *B24B 49/02* (2013.01); *B24B 49/04* (2013.01); *B24B 57/02* (2013.01); *C09G 1/02* (2013.01); *H01L 21/02024* (2013.01); *H01L 21/304* (2013.01); *H01L 21/30625* (2013.01); *H01L 21/67092* (2013.01)

(56) References Cited

FOREIGN PATENT DOCUMENTS

| | | | |
|---|---|---|---|
| JP | 2003-100668 A | 4/2003 | |
| JP | 2005-347453 A | 12/2005 | |
| JP | 2005347453 | * 12/2005 | ............. B24B 37/00 |
| JP | 2008-205147 A | 9/2008 | |
| JP | 2019-145750 A | 8/2019 | |
| KR | 10-2018-0002629 A | 1/2018 | |
| KR | 10-2019-0103422 A | 9/2019 | |
| WO | 2019/077687 A1 | 4/2019 | |

OTHER PUBLICATIONS

Jun. 20, 2025 Office Action issued in Chinese Patent Application No. 202180026701.0.

* cited by examiner

[FIG. 1]
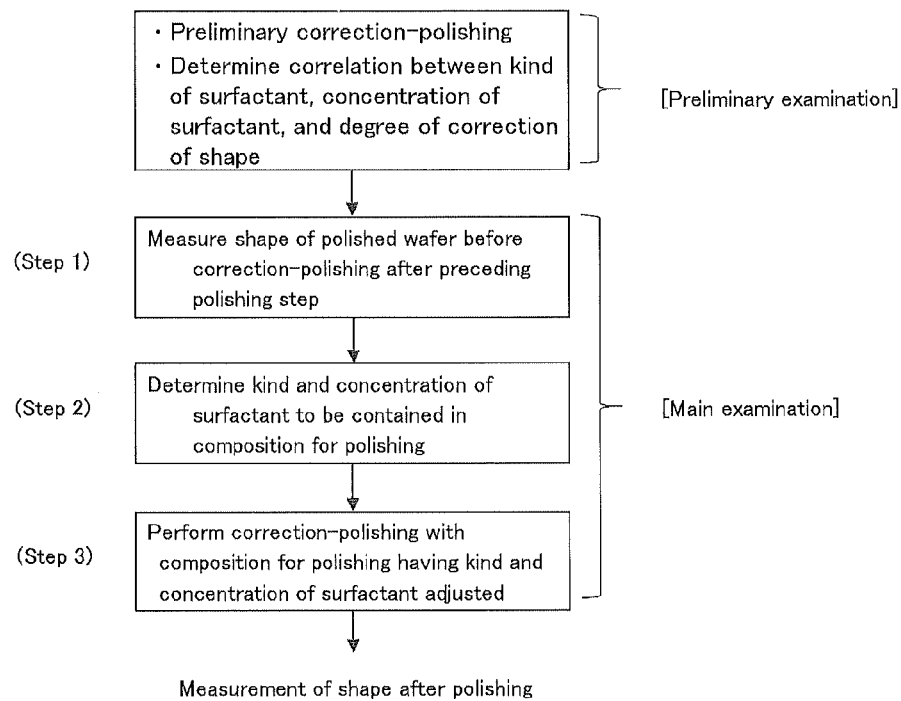
[FIG. 2]
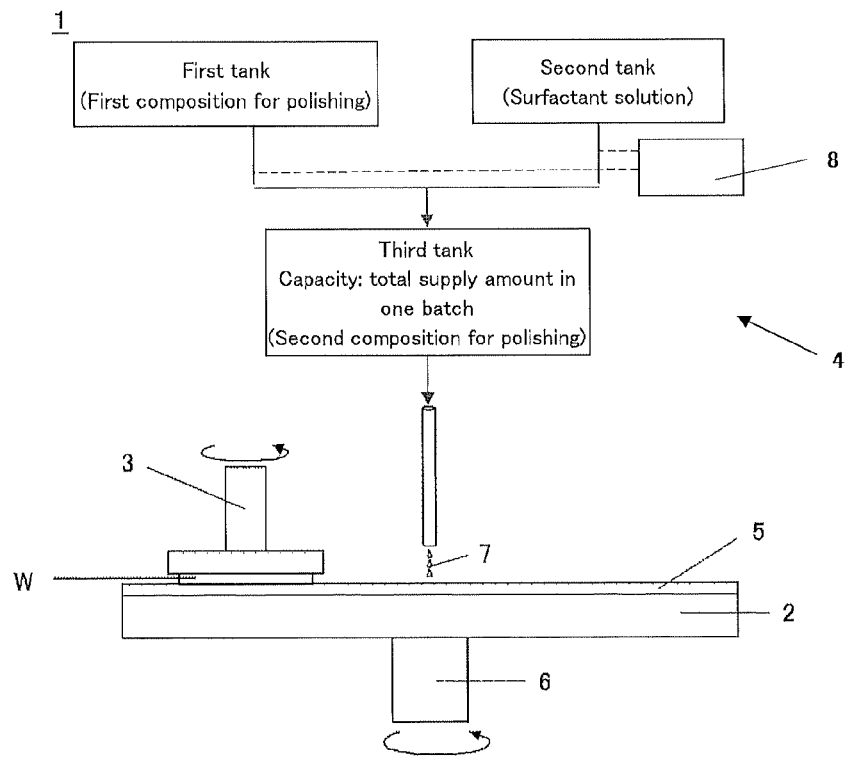

[FIG. 3]
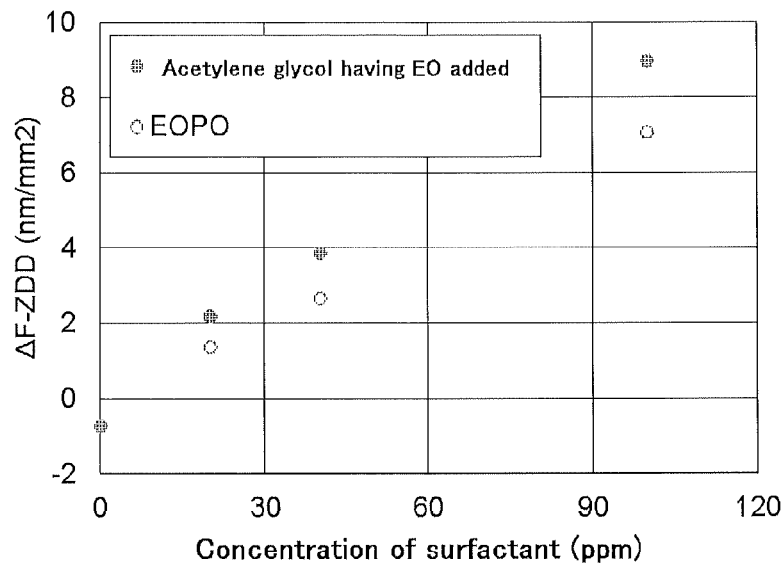
[FIG. 4]
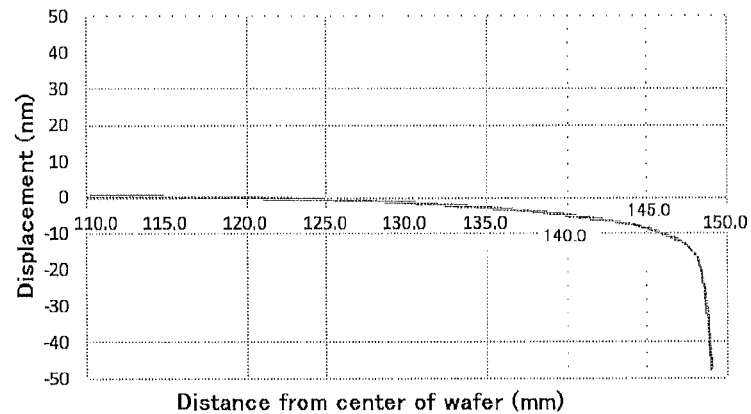
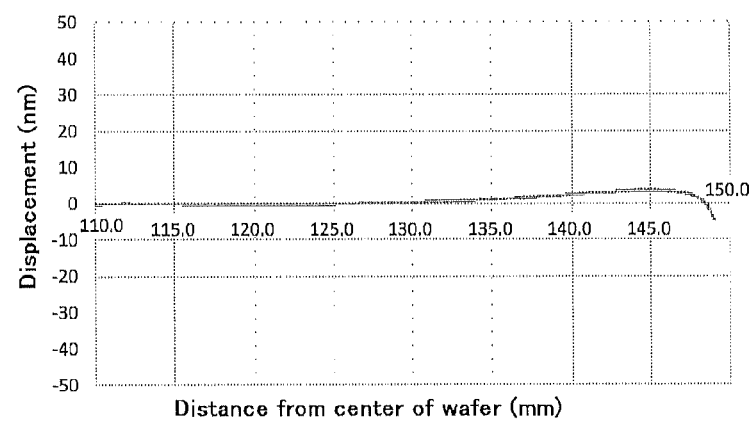

[FIG. 5]
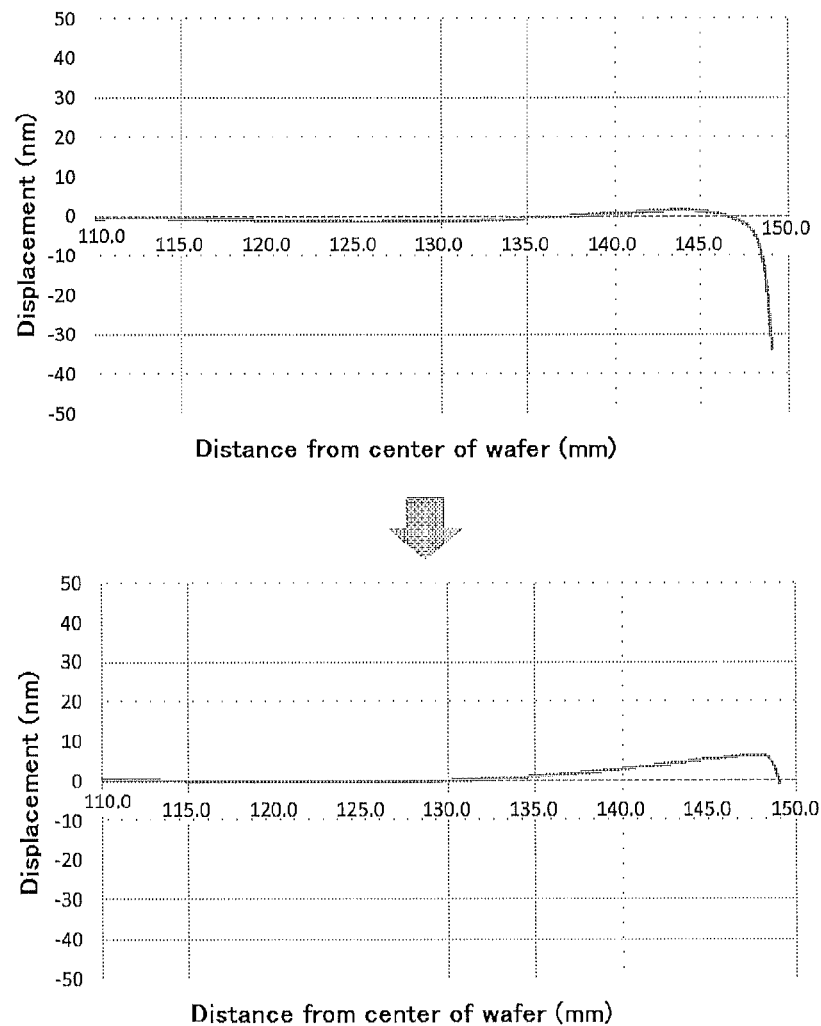

[FIG. 6]
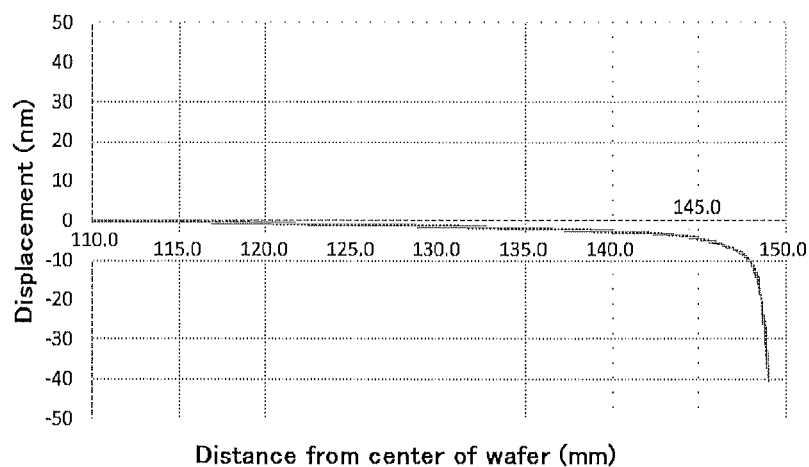
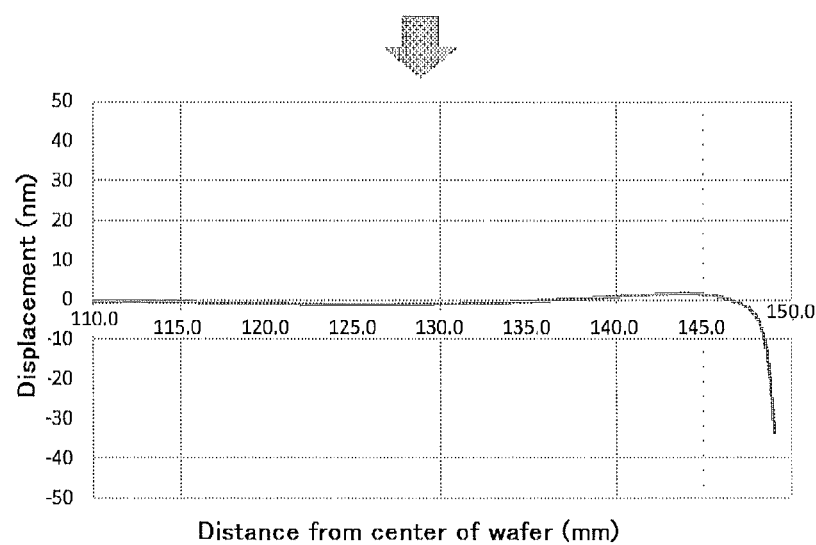

[FIG. 7]
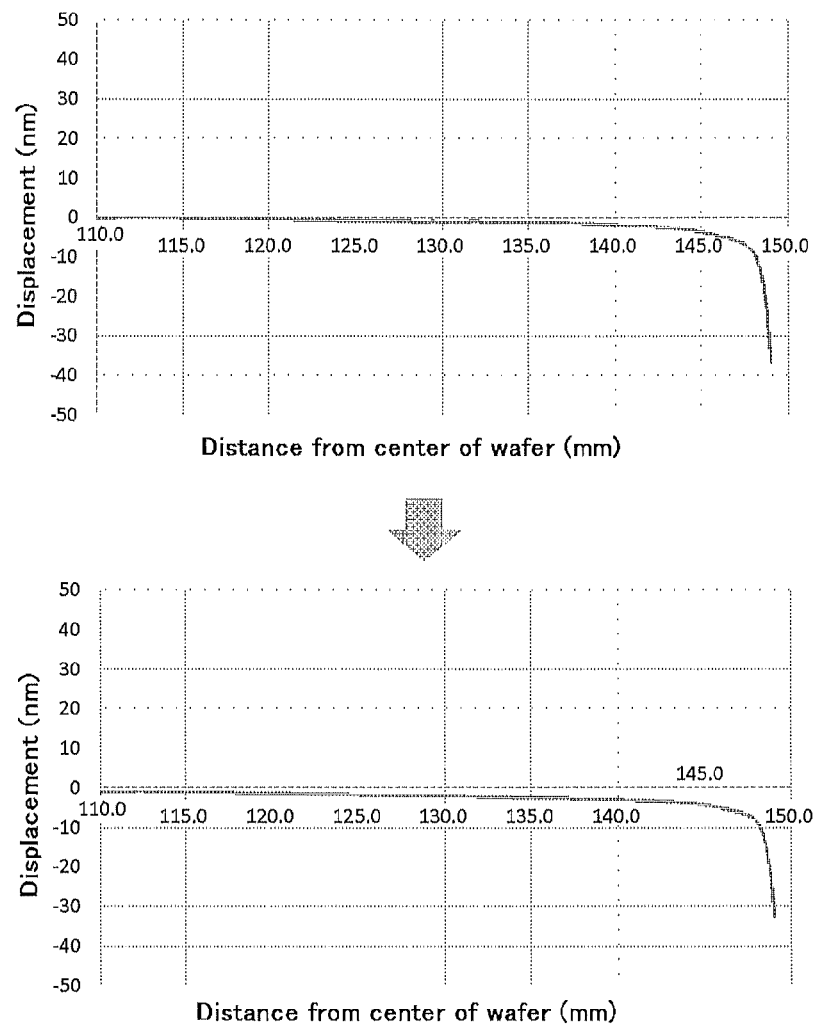

METHOD AND APPARATUS FOR POLISHING WAFER

TECHNICAL FIELD

The present invention relates to: a method for polishing a wafer; and an apparatus for polishing a wafer.

BACKGROUND ART

In recent years, with advancement of miniaturization of semiconductor devices using silicon wafers, high flatness has come to be required. SFQR (Site Front least Squares Range) or the like is a typical index of flatness. A cell having arbitrary dimensions (e.g. 26 mm×8 mm) is determined on a surface of a semiconductor wafer, and a plane obtained by the least-squares method regarding a surface of the cell is taken as a reference plane. In this event, the SFQR is defined as a range of a positive and negative deviation from the reference plane. If SFQR is degraded, a focus cannot be achieved during exposure when producing a semiconductor device, and there is a higher possibility of pattern failure occurring.

In addition, in view of reducing costs, wafers have come to be used to about 1 mm from the periphery for producing devices, and accordingly, flatness is required not only in the central portion, but also the edge. ESFQR (Edge Site Front least Squares Range) is a typical index of flatness in the edge.

Generally, a silicon wafer is processed by grinding and polishing a wafer sliced from an ingot.

Polishing is generally performed in multiple stages by using polishing pad having different degrees of hardness (see, for example, Patent Document 1), and grinding damage is removed by rough polishing, damage that occurred in the rough polishing is removed by secondary polishing, and roughness is created by final polishing.

It is known that the above-described SFQR and ESFQR are generally determined depending on the polishing process, and vigorous attempts have been made to improve the shape by altering polishing conditions and so forth.

Meanwhile, silicon wafer polishing processes are generally performed by multistage polishing processes having at least two or more stages in view of surface quality as described above. In a preceding stage, polishing is performed using a comparatively hard pad at a high rate in order to remove the damage from slicing and grinding, while in the latter stage, polishing is performed using a comparatively soft pad at a low rate so as not to inflict damage.

CITATION LIST

Patent Literature

Patent Document 1: JP 2008-205147 A

SUMMARY OF INVENTION

Technical Problem

However, from the viewpoint of flatness, it is not very desirable to perform polishing in multiple stages. This is because each stage of the polishing has a variation to the shape of the wafer, and therefore, the greater the number of stages, the greater the variation.

Therefore, in the latter stage of the polishing process, it is necessary to perform correction-polishing for reducing the variation in the shape of the polished wafer that occurred in the preceding stage of the polishing process.

Accordingly, the present invention has been made in view of such problems. An object of the present invention is to provide a method for polishing a wafer and a polishing apparatus according to which a variation in the shape of a polished wafer that occurs in the preceding stage of a polishing process can be reduced in the latter stage of a polishing process.

Solution to Problem

To achieve the object, the present invention provides a method for polishing a wafer in order to correct a shape of a polished wafer subjected to polishing, by pressing the wafer to a polishing pad while continuously supplying a composition for polishing containing water to perform correction-polishing, the method comprising the steps of:

measuring the shape of the polished wafer before performing the correction-polishing;

determining, in accordance with the measured shape of the polished wafer, a kind and concentration of a surfactant to be contained in the composition for polishing; and performing the correction-polishing while supplying the composition for polishing adjusted on a basis of the determined kind and concentration of the surfactant.

According to such a method for polishing a wafer, a variation in the shape of the polished wafer that occurred in the preceding stage of the polishing process can be reduced by the correction-polishing, which is the latter stage of the polishing process.

Preferably, when determining the kind and concentration of the surfactant, while supplying a composition for polishing having an altered kind and concentration of surfactant, a preliminary correction-polishing is performed on a preliminarily polished wafer subjected to polishing and then, from a change in a shape of the preliminarily polished wafer, a degree of correction of the shape before and after the preliminary correction-polishing is determined to determine a correlation between the kind of the surfactant, the concentration of the surfactant, and the degree of correction of the shape as a preliminary examination, a needed degree of correction of the shape is determined in accordance with the measured shape of the polished wafer, and the kind and concentration of the surfactant in the correction-polishing is determined on a basis of the correlation so as to achieve the determined degree of correction of the shape.

By determining the correlation between the kind of the surfactant, the concentration of the surfactant, and the degree of correction of the shape by the preliminary examination in this manner, the kind and concentration of the surfactant at the time of the correction-polishing can be determined simply, and shape-correction of the polished wafer can be performed as desired with more certainty.

Furthermore, when supplying the composition for polishing during the correction-polishing, a first tank for storing a first composition for polishing not containing the surfactant, a second tank for storing a surfactant solution containing the surfactant and water, and a third tank for storing a second composition for polishing prepared by mixing the first composition for polishing from the first tank and the surfactant solution from the second tank can be used, and the second composition for polishing in the third tank can be used as the composition for polishing in the correction-polishing.

By storing the composition for polishing not containing the surfactant and the surfactant solution separately and mixing the composition and the solution in the third tank in this manner, the concentration of the surfactant for the correction-polishing can be adjusted simply.

Furthermore, a tank having a capacity equal to a total supply amount of the second composition for polishing in one batch of the correction-polishing can be used as the third tank.

When a tank having such a capacity is used, the second composition for polishing to be used in the correction-polishing can be used up in one batch. Therefore, the amount of composition for polishing wasted can be reduced.

In addition, the composition for polishing during the correction-polishing can contain abrasive grains.

When abrasive grains are contained, polishing rate can be increased further.

In addition, the composition for polishing during the correction-polishing can contain a water-soluble polymer.

When a water-soluble polymer is contained, roughness of the wafer surface can be further improved.

Furthermore, the surfactant can have a contact angle of 50 degrees or less to bare silicon from which a surface natural oxide film is removed by HF immersion.

When such a surfactant is used, the stock removal of the outermost periphery of the wafer can be reduced more simply, and the flatness of a polished wafer that is thin in the outermost periphery can be improved further.

Furthermore, the polished wafer can be a silicon wafer.

The inventive method for polishing a wafer is particularly suitable for a silicon wafer that demands high flatness.

In addition, to achieve the above-described object, the present invention provides an apparatus for polishing a wafer, comprising a polishing pad and a supply mechanism for supplying a composition for polishing containing water, for correcting a shape of a polished wafer subjected to polishing, the apparatus pressing the wafer to the polishing pad while continuously supplying the composition for polishing from the supply mechanism to perform correction-polishing, wherein the supply mechanism is capable of supplying the composition for polishing containing a surfactant and having a kind and concentration of the surfactant in the composition for polishing adjusted in accordance with a measured value of the shape of the polished wafer before the correction-polishing.

Such an apparatus for polishing a wafer makes it possible to reduce the variation in the shape of the polished wafer that occurred in the preceding polishing step in the correction-polishing, which is the latter polishing step.

Furthermore, the supply mechanism can have a first tank for storing a first composition for polishing not containing the surfactant, a second tank for storing a surfactant solution containing the surfactant and water, and a third tank for storing a second composition for polishing prepared by mixing the first composition for polishing from the first tank and the surfactant solution from the second tank, and the second composition for polishing in the third tank can be suppliable as the composition for polishing during the correction-polishing.

When the supply mechanism is capable of storing the composition for polishing not containing the surfactant and the surfactant solution separately and mixing the composition and the solution in the third tank as described, the concentration of the surfactant for correction-polishing can be adjusted simply.

Furthermore, the third tank can have a capacity equal to a total supply amount of the second composition for polishing in one batch of the correction-polishing.

When the capacity is as described, the second composition for polishing used in the correction-polishing can be used up in one batch. Therefore, the amount of composition for polishing wasted can be reduced.

In addition, the supply mechanism can have a controller capable of controlling a flow rate of the surfactant solution supplied from the second tank to the third tank.

In this manner, the amount of the surfactant to be mixed in the composition for polishing can be adjusted easily, and therefore, the concentration of the surfactant can be altered easily.

In addition, the composition for polishing during the correction-polishing can contain abrasive grains.

When abrasive grains are contained, polishing rate can be further increased.

In addition, the composition for polishing during the correction-polishing can contain a water-soluble polymer.

When a water-soluble polymer is contained, roughness of the wafer surface can be improved further.

Furthermore, the surfactant can have a contact angle of 50 degrees or less to bare silicon from which a surface natural oxide film is removed by HF immersion.

When such a surfactant is used, the stock removal of the outermost periphery of the wafer can be reduced more simply, and the flatness of a polished wafer that is thin in the outermost periphery can be improved further.

Furthermore, the polished wafer can be a silicon wafer.

The inventive apparatus for polishing a wafer is particularly suitable for polishing a silicon wafer that demands high flatness.

Advantageous Effects of Invention

As described above, according to the inventive method and apparatus for polishing a wafer, a variation that occurred in the shape of the wafer in a preceding stage of a polishing process can be reduced by performing correction-polishing suitable for the shape of the polished wafer. In particular, it is possible to obtain wafers having higher flatness without variation.

BRIEF DESCRIPTION OF DRAWINGS

FIG. 1 is a flow diagram showing an outline of the inventive method for polishing a wafer.

FIG. 2 is a schematic view showing an example of the inventive apparatus for polishing a wafer.

FIG. 3 is a graph showing the correlation between the kind of the surfactant usable in the inventive method for polishing a wafer, the concentration of the surfactant, and the degree of correction.

FIG. 4 shows graphs showing the shape of the wafer before and after the correction-polishing in Example 1.

FIG. 5 shows graphs showing the shape of the wafer before and after the correction-polishing in Example 2.

FIG. 6 shows graphs showing the shape of the wafer before and after the correction-polishing in Comparative Example 1.

FIG. 7 shows graphs showing the shape of the wafer before and after the correction-polishing in Comparative Example 2.

DESCRIPTION OF EMBODIMENTS

The present inventors have added a surfactant to an existing composition for polishing and performed polishing, and found out that the stock removal of the outermost periphery was smaller than when no surfactant was added, and a so-called "rise" occurred.

Furthermore, the knowledge that the "rise" changes in stages in accordance with the kind or added concentration of the surfactant was also found out.

From this knowledge, the present inventors have found out that by altering, for each polishing of the wafer, the kind and concentration of the surfactant to be added to the composition for polishing depending on the shape of the wafer, it is possible to perform correction-polishing for suppressing variation in the wafer shape that occurred in the preceding stage of the polishing process, and completed the present invention.

Hereinafter, the present invention will be described in detail with reference to the drawings as an example of an embodiment. However, the present invention is not limited thereto.

FIG. 2 is an example of the inventive apparatus for polishing a wafer that can be used in the above-described correction-polishing step. Here, a case where a single side polishing apparatus is used will be described, but the present invention is not limited thereto, and a double-side polishing apparatus is also applicable. However, it is more preferable to perform by single side polishing from the viewpoint of controllability. Components and their mechanisms and functions will be described. As shown in FIG. 2, the single side polishing apparatus 1 is composed of a turn table 2 having a polishing pad 5 attached, a polishing head 3, and a supply mechanism 4. The turn table 2 can be rotated by the rotation of a rotary shaft 6, and the polishing head 3 can also be rotated. The polishing pad 5 is not particularly limited, and for example, a pad in which a foamed urethane pad or nonwoven fabric impregnated with urethane, a urethane suede pad, etc. can be used.

In addition, while supplying a composition 7 for polishing from the supply mechanism 4, a polished wafer W (this refers to a wafer that has already once been polished separately, and is also referred to as a polished wafer or simply a wafer) held by the polishing head 3 is brought into sliding contact with the polishing pad 5, and thus, the turn table 2 and the polishing head 3 are rotated to polish the polished wafer W. The present invention is particularly suitable for a silicon wafer that demands high flatness. However, the present invention is not limited to silicon wafers.

Here, the composition 7 for polishing contains a surfactant. In addition, the supply mechanism 4 is capable of supplying the composition 7 for polishing, where the kind and concentration of the surfactant to be contained in the composition 7 for polishing has been adjusted according to the measured value of the shape of the polished wafer W. Note that the measured value of the shape of the polished wafer will be described in the description of the inventive method.

Such a supply mechanism 4 preferably has a first tank for storing a first composition for polishing not containing the surfactant, a second tank for storing a surfactant solution containing the surfactant and water, and a third tank for storing a second composition for polishing prepared by mixing the first composition for polishing from the first tank and the surfactant solution from the second tank, and the second composition for polishing in the third tank can preferably be supplied to the polishing pad 5 as the composition 7 for polishing during the correction-polishing.

When the supply mechanism is thus capable of storing the composition for polishing not containing the surfactant and the surfactant solution separately and mixing the composition and the solution in the third tank, the concentration of the surfactant for correction-polishing can be adjusted simply.

In addition, the third tank preferably has a capacity equal to a total supply amount of the second composition for polishing in one batch of the correction-polishing. Note that one batch indicates a cycle of polishing performed simultaneously on a single polishing pad.

When the third tank has such a capacity, the composition 7 for polishing containing the surfactant can be used up in one batch, and therefore, loss of the composition 7 for polishing can be reduced.

In addition, the supply mechanism preferably has a controller 8 that can control a flow rate of the surfactant solution supplied from the second tank to the third tank.

Such a supply mechanism is capable of easily adjusting the amount of the surfactant to be mixed in the composition for polishing, and therefore, the concentration of the surfactant can be altered easily.

The first composition for polishing can contain abrasive grains in view of increasing the polishing rate. Among abrasive grains, $SiO_2$ is more preferable.

In addition, a basic compound is preferably contained. Among basic compounds, tetramethylammonium hydroxide, potassium hydroxide, sodium hydroxide, potassium carbonate, sodium carbonate, and ammonia are more preferable.

The first composition for polishing can contain a water-soluble polymer from the viewpoint of improving roughness. Among water-soluble polymers, hydroxyethyl cellulose, polyvinyl alcohol, and polyvinylpyrrolidone are more preferable.

The concentration of the surfactant in the composition 7 for polishing is basically determined from the shape before the correction-polishing, but is preferably 1000 ppm or less and more preferably 100 ppm or less from the viewpoint of hydrophilicity after the correction-polishing.

The type of the surfactant is not particularly limited, and any of a nonionic surfactant, a cationic surfactant, and an anionic surfactant can be used. However, in view of adsorption, a nonionic surfactant is preferable. Among nonionic surfactants, for example, polyoxyethylene-polyoxypropylene block copolymer, polyoxyethylene alkyl ether, polyoxyethylene alkyl phenyl ether, an HO adduct of ethylene glycol, an HO adduct of acetylene glycol, etc. are preferable.

Furthermore, the surfactant preferably has a contact angle of 50 degrees or less when a solution having, for example, 10 mass % of the surfactant dissolved in water is dropped onto a bare silicon from which a natural oxide film is removed with hydrogen fluoride (HF). Examples include ethylene oxide-propylene oxide block copolymer, ethylene oxide-propylene oxide random copolymer, polyoxyalkylene ether, acetylene glycol having HO added, and ethylene glycol having HO added.

By using such a surfactant, the shape of the stock removal of the outermost periphery of the wafer can be altered more efficiently. In particular, the stock removal of the outermost periphery of the wafer can be reduced, the flatness of the polished wafer that is thin in the outermost periphery can be improved more simply.

Note that when the sag shape of the outermost periphery of the wafer before correction-polishing is large, for example, and when it is desired to relieve the sag shape (induce a rise to achieve flatness) by correction-polishing, the smaller the contact angle, the more efficiently the stock removal of the outermost periphery of the wafer can be reduced in the correction-polishing. Therefore, the lower limit of the contact angle cannot be determined, and the contact angle is greater than zero.

Note that, when measuring the contact angle of the surfactant, the HF concentration is preferably 0.1 mass % or more, further preferably 0.3 mass % or more in view of the removal rate of the oxide film. In addition, the oxide film is preferably removed by immersing the wafer in HF, and in view of the amount to be removed, preferably for 10 sec or more, more preferably 30 sec or more, and further preferably 60 sec or more. After the immersion in HF, the contact angle is preferably measured within one week to prevent a natural oxide film from being formed again.

Furthermore, the concentration of the surfactant when measuring the contact angle is preferably 1 mass % or more, more preferably 3 mass % or more, and further preferably 10 mass % or more from the viewpoint of easy comparison. However, since the contact angle may not be measured correctly if viscosity is too high, the concentration is preferably 30 mass % or less, more preferably 10 mass % or less.

Furthermore, the contact angle is preferably measured by dropping a droplet from an upper surface of a bare silicon. In order to judge the adsorption state to the wafer, the contact angle is preferably measured after 1 sec or more after dropping, more preferably after 3 sec or more, and further preferably after 10 sec or more. The contact angle is measured by obtaining an image of the dropped droplet from the side and obtaining the angle at the contact portion of the wafer and the droplet.

Hereinbelow, the inventive method for polishing a wafer by using the single side polishing apparatus 1 of FIG. 2 will be described. FIG. 1 is a flow diagram showing an outline of the inventive method for polishing a wafer.

The example shown in FIG. 1 is roughly constituted from a preliminary examination and a main examination. Note that the preliminary examination can be performed as necessary, and when the correlation between the three described below is known, the preliminary examination can be omitted.

Below, each will be described in detail.
(Preliminary Examination)

Firstly, a preliminarily polished wafer subjected to polishing of a preceding stage is prepared. Here, a wafer similar to the polished wafer (e.g., a silicon wafer, etc.) to be subjected to correction-polishing in the main examination is prepared.

The shape of the preliminarily polished wafer is measured. Methods for measuring the shape are not particularly limited, and for example, a flatness measuring equipment WaferSight 1 manufactured by KLA-Tencor Co., Ltd. or the like can be used.

Next, a composition for polishing having an altered kind and concentration of surfactant is supplied to the preliminarily polished wafer to perform preliminary correction-polishing.

After that, the shape of the wafer after the preliminary correction-polishing is measured.

Subsequently, the degree of correction of the shape is determined from the change in the shape after the preliminary correction-polishing from before the preliminary correction-polishing. For example, the degree of correction of a peripheral sag can be determined.

The correlation between the degree of correction of the shape, the kind of the surfactant, and the concentration of the surfactant is determined.

When the correlation is thus determined by the preliminary examination in advance, the kind and concentration of the surfactant in the correction-polishing in the main examination described below can be determined simply. Moreover, the correction-polishing can be performed so as to achieve the desired shape more certainly.

Note that when information that is necessary for determining the conditions for the surfactant in the correction-polishing of the main examination is fully available, for example, when the above-described correlation is already known, etc., the preliminary examination can be omitted.
(Main Examination)

Firstly, as in step 1 of FIG. 1, the shape of the wafer to be subjected to correction-polishing, that is, the polished wafer subjected to the preceding polishing step, is measured.

Note that when there is a plurality of wafers to be subjected to correction-polishing, the shapes of all the polished wafers are preferably measured in advance before the correction-polishing in order to determine the concentration of the surfactant in the correction-polishing accurately.

Next, as in step 2 of FIG. 1, the kind and concentration of the surfactant to be contained in the composition 7 for polishing are determined in accordance with the measured shape of the polished wafer. For example, when there is a peripheral sag, the required degree of correction of the shape is determined so as to correct the peripheral sag and planarize the wafer. Then, on the basis of the correlation determined in the preliminary examination, the kind and concentration of the surfactant are determined such that the determined degree of correction of the shape can be obtained.

Next, as in step 3 of FIG. 1, correction-polishing is performed while supplying the composition 7 for polishing adjusted on the basis of the determined kind and concentration of the surfactant.

To perform this correction-polishing, a special supply mechanism 4 that is capable of altering the concentration of the surfactant in the composition 7 for polishing for every batch of the polishing is suitable.

Firstly, a first composition for polishing is prepared in a first tank while a surfactant solution is prepared in a second tank, and using a controller 8, the flow rate from the second tank to the third tank (and the flow rate from the first tank to the third tank) is controlled. As the second composition for polishing, the desired composition 7 for polishing having the kind and concentration of surfactant such as those determined in step 2 is adjusted in the third tank.

Then, the polished wafer is set to the polishing apparatus 1, and the correction-polishing of the polished wafer is performed while supplying the composition 7 for polishing.

This series of steps in the main examination is performed for each polished wafer. Note that when there is a plurality of polished wafers, it is also possible to perform step 1 and step 2 on all the polished wafers beforehand, and then proceed to step 3. This can be decided appropriately considering efficiency and so forth.

Incidentally, the shape can be measured after the correction-polishing as necessary to check whether there has been an improvement.

Meanwhile, the second composition for polishing is preferably supplied at a flow rate of 0.1 l/min or more, more preferably at 0.3 l/min or more in view of surface quality. On the other hand, in view of costs, the second composition for polishing is preferably supplied at a flow rate of 5.0 l/min or less, more preferably 3.0 l/min or less.

The correction-polishing is desirably performed after a double-side polishing process, and is further preferably performed before the final polishing.

Furthermore, from the viewpoint of reducing the variation in the shape of the wafer, the number of wafers loaded in one batch is preferably 5 or less, more preferably 3 or less.

From the viewpoint of controlling the shape of the wafer, the correction-polishing is preferably performed for 3 sec or more, more preferably 5 sec or more. On the other hand, from the viewpoint of productivity, the correction-polishing is preferably within 300 sec, more preferably within 180 sec.

The correction-polishing may include another polishing step with the same polishing pad and supplying a different composition for polishing before or after the correction-polishing.

According to the inventive apparatus and method for polishing a wafer as described above, the variation in wafer shape that occurred in a preceding polishing step can be reduced.

EXAMPLE

Hereinafter, the present invention will be described more specifically with reference to Examples and Comparative Examples. However, the present invention is not limited to the Examples.

Examples 1 and 2

10-mass % solutions of various water-soluble polymers and surfactants were prepared, and then dropped onto a bare silicon immersed in 1-mass % HF for 1 min to measure the contact angle. The results are shown in Table 1. In standards using only water containing no additives and standards using added hydroxyethyl cellulose or polyvinyl alcohol, which are water-soluble polymers, the contact angle remained high, whereas, using ethylene oxide-propylene oxide block copolymer (EO-PO) or acetylene glycol having EO added, which are surfactants, it was observed that the contact angle had considerably decreased.

TABLE 1

|  | Water | Hydroxyethyl cellulose (HEC) | Polyvinyl alcohol (PVA) | Ethylene oxide-propylene oxide block copolymer (EO-PO) | Acetylene glycol (EO-added) |
|---|---|---|---|---|---|
| Contact angle | 70 degrees | 63 degrees | 65 degrees | 42 degrees | 38 degrees |

As Examples 1 and 2, the following preliminary examination and main examination were performed. Firstly, the preliminary examination shown in FIG. 1 was performed to determine the correlation between the kind of the surfactant having a contact angle of 50 degrees or less as described above, the concentration of the surfactant, and the degree of correction of the shape.

First, a preliminarily polished wafer (here, a silicon wafer) similar to the wafer used in the following main examination was prepared, and the value of the ZDD (radial double derivative of Z [height]) on a front side of the wafer was measured. This wafer was subjected to preliminary correction-polishing by using a polishing apparatus as shown in FIG. 2 while using compositions for polishing having altered concentrations of EO-PO and EO-added acetylene glycol. After that, the value of the ZDD on the front side of the wafer was measured again for each concentration of each surfactant, and the correlation between the kind, concentration, and degree of correction of the shape (that is, the AF-ZDD before and after the correction-polishing) was obtained. The results are shown in FIG. 3.

Here, ZDD is an index that indicates the change in the gradient (curvature) near the edge obtained by the secondary differentiation of the variation profile of the wafer surface from the center of the wafer to the outermost periphery. When ZDD has a positive value, this indicates that the surface has a displacement in a rising direction due to the correction-polishing, and on the contrary, when ZDD has a negative value, this indicates that the surface has a displacement in a sagging direction.

Subsequently, the main examination was performed. The polished wafer obtained by actually polishing in a preceding step (primary polishing step) was correction-polished, specifically, in the following manner.

A plurality of wafers after primary polishing were prepared, and cross sectional shapes were obtained using a flatness measuring equipment WaferSight 1 manufactured by KLA-Tencor Co., Ltd. The polished wafers prepared on this occasion were all thin in the outermost periphery, and had a so-called "sagging" shape. In addition, there was variation in shape between the polished wafers.

In order to improve the respective sag shape from the measured shape of the polished wafers, the kind and concentration of the surfactant to be contained in the composition for polishing was determined on the basis of the correlation shown in FIG. 3. Here, among these, 10 ppm of ethylene oxide-propylene oxide block copolymer (EO-PO) (Example 1) and 10 ppm of acetylene glycol having EO added (Example 2) were appointed as two examples. In the case of the shapes of the polished wafers in Examples 1 and 2, the polished wafer would have a displacement to a rising direction in an extent to relieve the sag shape owing to the correction-polishing using the composition for polishing with the kind of surfactant and the concentration of the surfactant described above, and the shape can be made flat after the correction-polishing.

Next, the polished wafer whose shape had been measured was subjected to correction-polishing using the polishing apparatus as shown in FIG. 2. The correction-polishing was performed using a polishing pad in which a nonwoven fabric was impregnated with urethane resin.

As the composition for polishing, a composition using potassium hydroxide as a basic compound and containing colloidal silica as abrasive grains was used.

After correction-polishing, final polishing and cleaning were performed, and then the cross sectional shape was obtained again by using WaferSight 1.

Comparative Examples 1 and 2

Besides Examples 1 and 2, inspection was also conducted regarding a composition containing no water-soluble polymers or surfactants (Comparative Example 1) and a composition containing 10 ppm of polyvinyl alcohol (PVA), which is a water-soluble polymer (Comparative Example 2). Note that conventional compositions for polishing were simply used, and no preliminary examination or consideration of the wafer shape before the correction-polishing was performed, unlike in Examples 1 and 2.

The shape of each wafer in Examples 1 and 2 and Comparative Examples 1 and 2 before and after the correction-polishing is respectively shown in FIGS. 4 to 7. In each figure, the upper side is the shape before the correction-polishing, and the lower side is the shape after the correction-polishing.

As shown in FIG. 4, in Example 1, where the correction-polishing was performed with 10 ppm of the surfactant EO-PO added, the flatness particularly near the edge resulted in being greatly improved.

Meanwhile, as shown in FIG. 5, in Example 2, where the correction-polishing was performed with 10 ppm of the surfactant acetylene glycol having EO added, flatness was also greatly improved near the edge in the same manner.

The results of Examples 1 and 2 were as originally intended (create a rise to achieve flatness). In addition, regarding other polished wafers, sagging was also corrected in the same manner, and variation between the wafers in shape was successfully reduced.

On the other hand, as shown in FIG. 6, in Comparative Example 1, where no water-soluble polymers or surfactants were added, and correction-polishing was performed with only potassium hydroxide and colloidal silica, it can be observed that the shape was hardly corrected.

Meanwhile, as shown in FIG. 7, in Comparative Example 2, where correction-polishing was performed with 10 ppm of PVA added as a water-soluble polymer, it can be observed that hardly any correction was achieved as in Comparative Example 1.

In Comparative Examples 1 and 2, where the present invention was not performed, it was not possible to correct the sag as described above, and it was not possible to reduce the variation between the wafers in shape.

As described above, by determining the kind and concentration of the surfactant in the composition for polishing in accordance with the shape of the polished wafer as in Examples 1 and 2, which are the present invention, it is possible to correct the shape of the polished wafer that occurred in the preceding polishing step, and as a result, the variation in shape between wafers can be improved.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for polishing a wafer in order to correct a shape of a polished wafer subjected to polishing, by pressing the wafer to a polishing pad while continuously supplying a composition for polishing containing water to perform correction-polishing, the method comprising the steps of:
   measuring the shape of the polished wafer before performing the correction-polishing;
   determining, in accordance with the measured shape of the polished wafer, a kind and concentration of a surfactant to be contained in the composition for polishing; and
   performing the correction-polishing of the polished wafer whose shape was measured while supplying the composition for polishing adjusted on a basis of the determined kind and concentration of the surfactant.

2. The method for polishing a wafer according to claim 1, wherein, when determining the kind and concentration of the surfactant,
   while supplying a composition for polishing having an altered kind and concentration of surfactant, a preliminary correction-polishing is performed on a preliminarily polished wafer subjected to polishing and then, from a change in a shape of the preliminarily polished wafer, a degree of correction of the shape before and after the preliminary correction-polishing is determined to determine a correlation between the kind of the surfactant, the concentration of the surfactant, and the degree of correction of the shape as a preliminary examination,
   a needed degree of correction of the shape is determined in accordance with the measured shape of the polished wafer, and
   the kind and concentration of the surfactant in the correction-polishing is determined on a basis of the correlation so as to achieve the determined degree of correction of the shape.

3. The method for polishing a wafer according to claim 2, wherein, when supplying the composition for polishing during the correction-polishing,
   a first tank for storing a first composition for polishing not containing the surfactant,
   a second tank for storing a surfactant solution containing the surfactant and water, and
   a third tank for storing a second composition for polishing prepared by mixing the first composition for polishing from the first tank and the surfactant solution from the second tank are used, and
   the second composition for polishing in the third tank is used as the composition for polishing in the correction-polishing.

4. The method for polishing a wafer according to claim 3, wherein a tank having a capacity equal to a total supply amount of the second composition for polishing in one batch of the correction-polishing is used as the third tank.

5. The method for polishing a wafer according to claim 1, wherein, when supplying the composition for polishing during the correction-polishing,
   a first tank for storing a first composition for polishing not containing the surfactant,
   a second tank for storing a surfactant solution containing the surfactant and water, and
   a third tank for storing a second composition for polishing prepared by mixing the first composition for polishing from the first tank and the surfactant solution from the second tank are used, and
   the second composition for polishing in the third tank is used as the composition for polishing in the correction-polishing.

6. The method for polishing a wafer according to claim 5, wherein a tank having a capacity equal to a total supply amount of the second composition for polishing in one batch of the correction-polishing is used as the third tank.

7. The method for polishing a wafer according to claim 1, wherein the composition for polishing during the correction-polishing contains abrasive grains.

8. The method for polishing a wafer according to claim 1, wherein the composition for polishing during the correction-polishing contains a water-soluble polymer.

9. The method for polishing a wafer according to claim 1, wherein the surfactant has a contact angle of 50 degrees or less to bare silicon from which a surface natural oxide film is removed by HF immersion.

10. The method for polishing a wafer according to claim 1, wherein the polished wafer is a silicon wafer.

\* \* \* \* \*